United States Patent [19]
Hansen et al.

[11] Patent Number: 5,672,400
[45] Date of Patent: Sep. 30, 1997

[54] ELECTRONIC ASSEMBLY WITH SEMI-CRYSTALLINE COPOLYMER ADHESIVE

[75] Inventors: Dennis D. Hansen, Luck, Wis.; Michael A. Kropp, Cottage Grove; Glen Connell, Pine Springs, both of Minn.

[73] Assignee: Minnesota Mining and Manufacturing Company

[21] Appl. No.: 576,710

[22] Filed: Dec. 21, 1995

Related U.S. Application Data

[60] Provisional application No. 60/004,219 Sep. 25, 1995.
[51] Int. Cl.[6] ............................................. B32B 9/00
[52] U.S. Cl. .................... 428/40.1; 428/209; 428/901; 361/748; 361/750; 361/762
[58] Field of Search ................................ 428/209, 901, 428/40; 361/748, 762, 750

[56] References Cited

U.S. PATENT DOCUMENTS

| | | |
|---|---|---|
| 4,698,242 | 10/1987 | Salerno . |
| 4,942,140 | 7/1990 | Ootsuki et al. . |
| 5,143,785 | 9/1992 | Pujol et al. . |
| 5,334,430 | 8/1994 | Ishikawa ........................... 428/40 |

OTHER PUBLICATIONS

"PEBAX" Brochure, Atochem S.A., Dec. 1987.
"PEBAX 3533 SA 00" Brochure, Atochem S.A., Apr. 1988.
"Fluxless Flip Chip Bonding on Flexible Substrates: A Comparison Between Adhesive Bonding and Soldering," Aschenbrenner et al., Fraunhofer–Institut for Zuverlassigkeit und Mikrointegration (IZM), pp. 91–101, 1994.
"Viscoelastic Properties of Polymers," Ferry, Second Edition, Chapter 2, pp. 40–51, John Wiley & Sons, Inc., 1970.
"Investigations into the Use of Adhesives for Level–1 Microelectronic Interconnections," Hogerton et al., *Mat. Res. Soc. Symp. Proc.*, vol. 154, 1989 Materials Research Society, pp. 415–424.

*Primary Examiner*—Patrick Ryan
*Attorney, Agent, or Firm*—Gary L. Griswold; Walter N. Kirn; H. Sanders Gwin, Jr.

[57] ABSTRACT

The present invention provides a microelectronic assembly wherein a semi-crystalline copolymer adhesive composition, preferably provided in the form of a film, is used to electrically interconnect a first circuit pattern on a first substrate to a second circuit pattern on a second substrate. The adhesive composition preferably includes a semi-crystalline copolymer comprising polyether and polyamide monomeric units, a tackifier, and conductive particles.

2 Claims, 3 Drawing Sheets

ELECTRONIC ASSEMBLY WITH SEMI-CRYSTALLINE COPOLYMER ADHESIVE

CROSS-REFERENCE TO RELATED APPLICATION

This application claims priority to U.S. Provisional patent application Ser. No. 60/004,219 filed Sep. 25, 1995, abandoned.

1. Field of the Invention

The present invention relates to a microelectronic assembly in which a first bonding site on a first substrate is adhesively electrically interconnected to a second bonding site on a second substrate or to a bonding site on an electronic device. More particularly, the present invention relates to a microelectronic assembly wherein a semi-crystalline copolymer adhesive composition, preferably provided in the form of a film, is used to electrically interconnect a first circuit pattern on a first substrate to a second circuit pattern on a second substrate or to a bonding site on an electronic device. Even more particularly, the present invention relates to a microelectronic assembly in which an adhesive film comprising a polyether-polyamide copolymer, a tackifier and conductive particles is used to electrically interconnect a first circuit pattern on a first substrate to a second circuit pattern on a second substrate or to a bonding site on an electronic device.

2. Background of the Invention

It is well known that a conductive adhesive may be used to form a bond that provides both electrical and thermal conductivity between the circuitry on two substrates. Early liquid epoxy adhesive compositions required constant mixing to maintain a suitable dispersion of silver or other conductive particles, and were dispensed in excess to wet the entire bonding surface during placement of the substrates to be bonded. These liquid adhesive compositions by their nature migrated due to capillary action and often contaminated or covered critical areas of the substrate in which no adhesive could be tolerated.

In contrast, a film may be cut to a precise size, and provides the exact amount of adhesive in the precise area necessary for effective bonding. Flow of the adhesive is limited, and appropriate materials may be selected so that flow only occurs near the bonding temperature.

As noted in U.S. Pat. No. 5,143,785 to Pujol et al., adhesive films can be used to establish multiple, discrete electrical interconnections between two substrates. For these applications, the adhesive film may contain sparse populations of fine conductive particles which provide electrical conductivity through the thickness of the film, but not in the plane of the film (anisotropically conductive, or Z-axis films). The use of a film type adhesive for these applications provides the possibility of using either a random or a uniform particle distribution, which is a choice that is not available when using paste or liquid systems. Unlike solder interconnections, Z-axis films provide pressure engaged interconnections. The role of the adhesive is to establish and maintain normal forces at each interface to provide stable and low resistance interconnections. The source of these normal forces is thermal stress which builds during cooldown from the bonding temperature and which is the direct result of thermal expansion mismatch between the adhesive and the conductive particles. Since the Z-axis adhesives are in direct contact with electrical circuitry, the adhesive matrix containing the conductive particles must also protect the contacted portion of the circuitry from galvanic corrosion. It is important that the adhesives be essentially free of extractable ionic impurities and possess low moisture absorption.

U.S. Pat. No. 4,820,446 (Prud'homme) describes a repairable thermoplastic adhesive for electronic applications which contains a block copolymer made up of polysiloxane and urethane groups and conductive particles. However, this and other related adhesives display high deformation at elevated stress and temperature, which leads to poor contact stability. Accordingly, such adhesives are useful only in applications involving limited stress, and are almost exclusively used to bond lightweight, flexible circuits to other components in which thermal stresses are minimal.

While certain highly crosslinkable, thermosetting adhesive films perform adequately in high stress applications, these adhesives are not repairable, i.e., they cannot be removed from the substrate without leaving a residue or degrading the substrate surface. An example of a non-repairable adhesive composition which has superior shear-strengths at high temperatures is the phenoxy and epoxy admixture disclosed in U.S. Pat. No. 4,769,399 (Schenz).

Pujol et at., U.S. Pat. No. 5,143,785 and U.S. Pat. No. 5,457,149 (Hall et al.) disclose reworkable, crosslinkable systems for use in electronic applications which contain admixtures of cyanate ester resins and a thermoplastic polymer. These systems provide the very desirable reworkable property, but a non-reactive reworkable adhesive would provide further advantages such as, for example, increased shelf life.

U.S. Pat. No. 5,061,549 (Shores) describes heat activated adhesive films suitable for electronic applications. The adhesive's main constituent is a thermoplastic polymer with a Vicat softening temperature of from 70° C. to 280° C. Shores exemplifies a number of thermoplastic polymers (column 3, lines 14–48). While amorphous thermoplastic polymers do provide shoe bonding times and repairability/reworkability for bonded circuit components, they do not have the strength above glass transition temperature ($T_g$) to provide a high level of dimensional stability or the steep viscosity/temperature gradient in the vicinity of the melt temperature ($T_m$) that produces excellent flow of the adhesive during bonding.

In addition, when conventional amorphous thermoplastic polymers are used as adhesives in highly stressed electronics applications, it is normally required that the $T_g$ of the polymer exceed the maximum temperature encountered in the use environment ($T_{max}$) to assure sufficient creep resistance to maintain electrical contact between chip and substrate. It is for this reason that many electronic die-attach adhesives are "cured" (chemically crosslinked) to raise $T_g$ above $T_{max}$.

In addition to the thermoplastic and thermoset adhesive systems, thermoplastic/thermoset blends are of possible interest for electrical interconnections. Such mixtures have been designed to improve high temperature performance of the thermoset materials, and/or to improve the fracture toughness of the thermoset material. See U.S. Pat. No. 3,530,087 (Hayes et al.); and R. S. Bauer, *Toughened High Performance Epoxy Resins: Modifications with Thermoplastics,* 34th International SAMPE Symposium, May 8–11, 1989.

Thermoplastic elastomers have also been used in place of thermoplastics for conductive adhesives, as described in, for example, JP 62 40217, JP-A 52 79644, JP-A 52 47424, JP 2261879, JP 2261878, JP 01185380, JP 63 086781, JP 62 181378 and JP 62 181379. Commonly mentioned materials specified are block copolymers, such as styrene-ethylenebutylene-styrene (SEBS). In these materials, distinct styrene domains provide some reinforcement through physical crosslinks. These are most often blended with tackifiers, and can provide good mechanical strength.

Some materials, such as ethylene vinyl acetate, are semi-crystalline and are often mentioned as usable conductive adhesives. However, the low melt temperatures (<80° C.) indicate that they will not provide sufficient reinforcement at elevated temperatures.

The well known process of Flipped Direct Chip Attachment (FDCA) may also be used to adhesively electrically interconnect a bonding site on an electronic device directly to a bonding site on a substrate. In FDCA, a heat-bondable adhesive, which may or may not be curable, is used to provide an intimate mechanical flip-chip bond. The adhesive also provides pressure-engaged, rather than metallurgical, electrical interconnections to the substrate. In one method described in U.S. Pat. No. 4,749,120 to Hatada, a liquid, curable, non-conductive adhesive maintains pressure engaged electrical connections between an array of metallic bumps on a chip and corresponding metallic circuit traces on a substrate. The presence of the adhesive at the interface between the components moderates the shear strain and provides an increased capacity to accommodate mismatches in the coefficients of thermal expansion (CTE) and elastic moduli between the components.

While the adhesive materials described above are effective in certain applications and end-use environments, there remains a need for a non-reactive adhesive with a balance of properties particularly suited to electronic interconnect applications. The suitable adhesive must flow sufficiently at a modest bonding temperature to intimately contact the substrates to be electrically interconnected. In addition, the adhesive composition must bond rapidly at the bonding temperature. Once the bonding operation is complete, the suitable adhesive must have sufficient toughness to provide good resistance to peel, and must have high modulus and creep resistance sufficient to withstand significant stress and/or high temperatures, at least through the range of use. The adhesive should also be reworkable at a processing temperature that is sufficiently low so that the substrate is not damaged during removal of an electronic device. The adhesive should have an extended shelf life at room temperature (i.e., is storage-stable) and a low viscosity at the intended bonding temperature to provide good flow properties. The adhesive must have low moisture adsorption to resist conditions of up to 85° C. and 85% relative humidity. At present, a material with such a combination of properties suitable for use as a Z-axis adhesive or an adhesive for FDCA has not been identified.

SUMMARY OF THE INVENTION

The present invention relates to a microelectronic assembly in which a first bonding site on a first substrate is adhesively electrically interconnected to a second bonding site on a second substrate or to a bonding site on an electronic device. More particularly, the present invention relates to a microelectronic assembly wherein a copolymer adhesive composition, preferably provided in the form of a film, is used to electrically interconnect a first circuit pattern on a first substrate to a second circuit pattern on a second substrate or to a bonding site on an electronic device. The adhesive composition comprises a semi-crystalline polymeric material and a tackifier, and preferably also contains conductive particles. The adhesive composition has a ratio of the loss modulus (G") to the storage modulus (G'), tan δ, of about 1 at a temperature of about 90° C. to about 150° C. as measured at 1 rad/sec. At the temperature where tan δ=1, the polymeric material has a storage modulus of less than about $2 \times 10^5$ dynes/cm$^2$; and, at a temperature 20° C. below the temperature where tan δ=1, the adhesive composition has a storage modulus greater than about $543 \times 10^5$ dynes/cm$^2$. The maximum value of tan δ, the glass transition temperature, $T_g$, of the adhesive composition is about $-10°$ C. to about 40° C.

The adhesive composition of the invention preferably includes a copolymer made up of polyamide monomeric units and polyether monomeric units, a tackifier, and conductive particles. The adhesive composition may be provided as a bulk material for hot-melt application, as a film adhesive with an optional release liner, or pre-attached to an electronic substrate material such as, for example, a flex circuit.

The present invention also provides a method for electrically interconnecting a first substrate to a second substrate or a bump on an electronic device using the adhesive composition of the invention.

The adhesive composition used in the electronic assembly of the invention has an excellent balance of properties compared to conventional thermoplastic adhesive materials. The semi-crystalline nature of the copolymer provides sharp melting for low temperature bonding of electronic devices to a wide variety of substrates. The bond formed has a high modulus and excellent resistance to creep. In addition, the elastic nature of the material provides a compliant, non-brittle bond with excellent peel strength for ease of handling in manufacture and assembly processes.

DETAILED DESCRIPTION OF THE INVENTION

Figure 1:
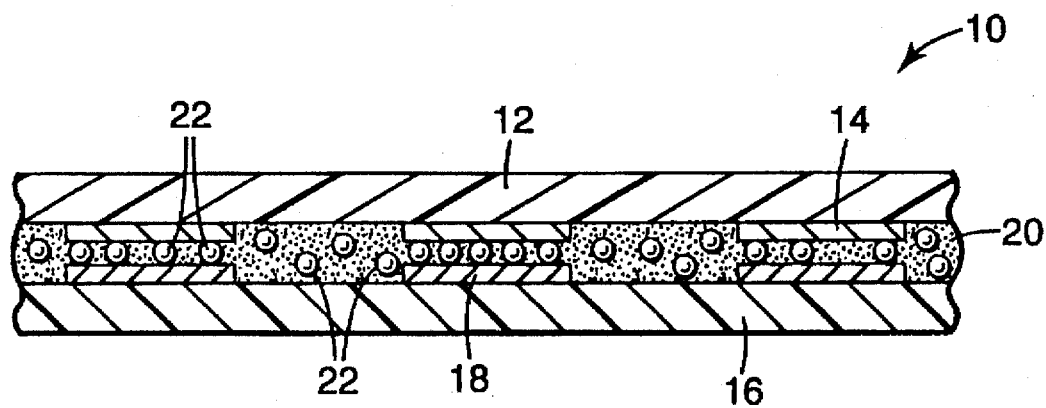
FIG. 1 is a cross-sectional view of an electronic assembly of the present invention.

The present invention relates to a microelectronic assembly in which a first bonding site on a first substrate is adhesively electrically interconnected to a second bonding site on a second substrate or to a bonding site on an electronic device. A semi-crystalline copolymer adhesive composition, which may be provided in the form of a film, a bead, a thread, a dot, or a non-woven web, is used to electrically interconnect the first bonding site on the first substrate to the second bonding site on the second substrate. A typical electronic assembly according to the present invention is shown in FIG. 1. In the electronic assembly 10 a first substrate 12 having a first array of metallic bonding sites or circuit traces 14 on a surface thereof is adhesively attached to a second substrate 16 having a second array of bonding sites or circuit traces 18 on a surface thereof. An adhesive material 20, preferably a film, resides between the first substrate 12 and the second substrate 16 to provide an adhesive bond between them. Conductive particles 22 reside between and electrically interconnect the individual bonding sites 14 in the first array and the individual bonding sites 18 in the second array, and provide electrical connection between the first substrate 12 and the second substrate 16.

Figure 2:
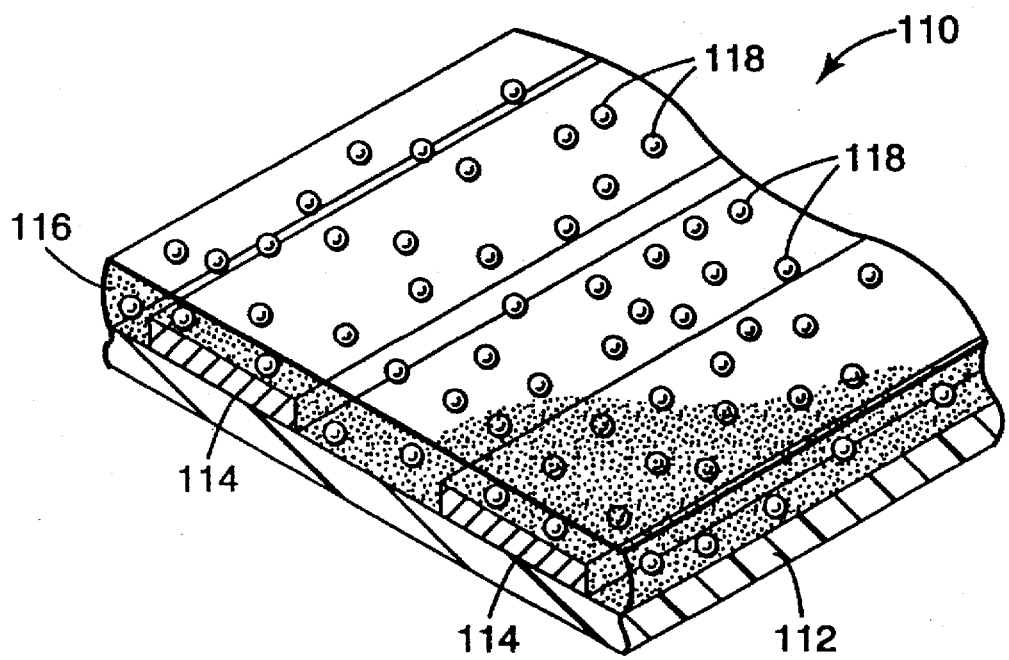
FIG. 2 is a plan view of an electronic assembly of the invention.

The electronic assembly of the present invention may also be provided in the form shown in FIG. 2. In FIG. 2 the electronic assembly 110 includes a substrate 112 having metallic circuit traces 114 on an upper surface thereof. An adhesive 116, preferably in the form of a film, is applied on the upper surface of the substrate and covers the circuit traces 114. When the assembly 110 is bonded to a second substrate (not shown), a population of conductive particles 118 in the adhesive film provides electrical interconnection between the circuit traces 114 and the corresponding bonding sites on the second substrate.

Figure 3:
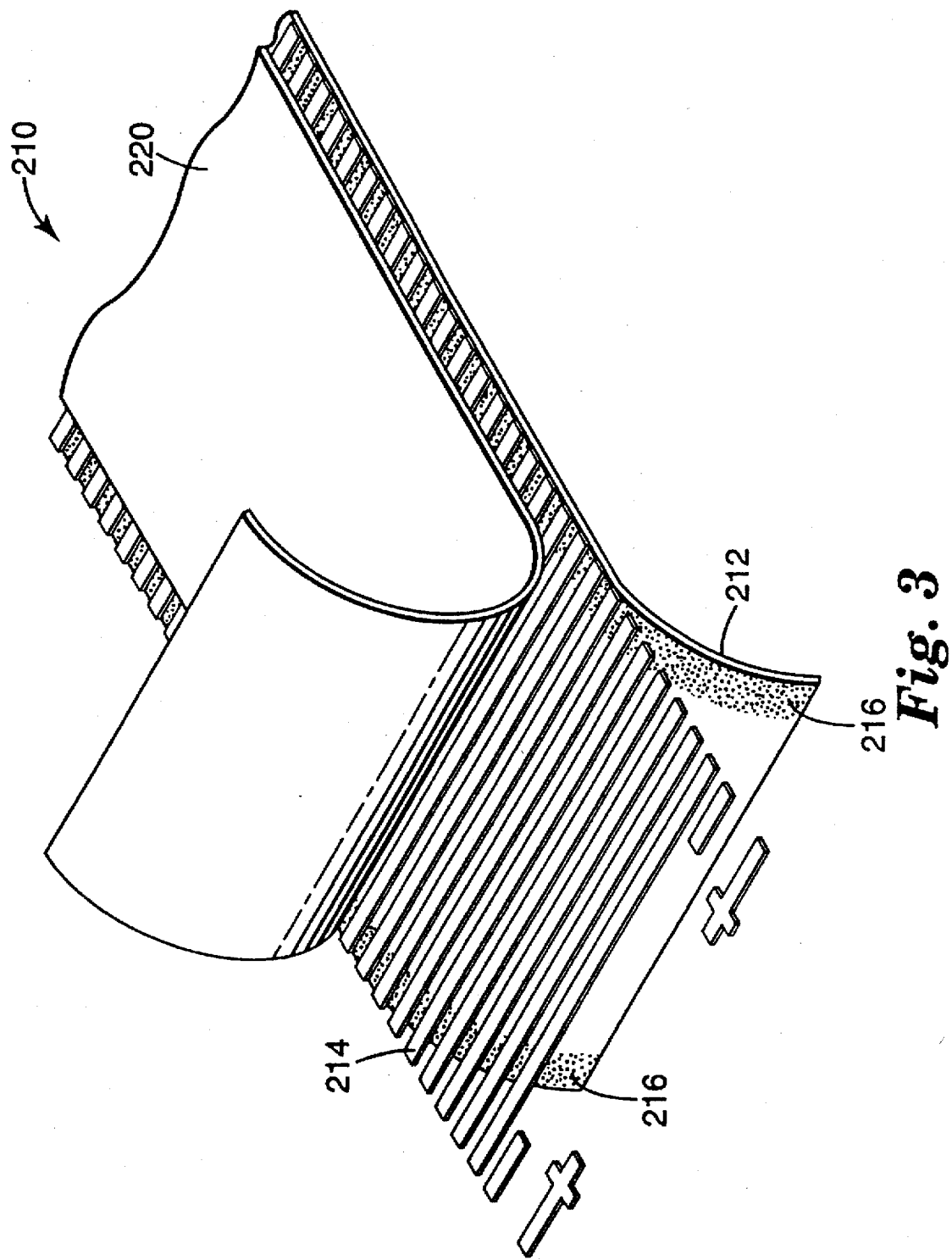
FIG. 3 is an exploded view of an electronic assembly of the invention.

Yet another embodiment of the electronic assembly of the present invention is shown in FIG. 3. The electronic assembly 210 in FIG. 3 is a flexible jumper which may be used to interconnect circuit boards, flat panel displays, or flexible circuits. The substrate 212 is a flexible polymeric material, preferably polyethylene terepthalate (PET), having a conductive metallic circuit 214 on a surface thereof. Opposed strips 216 of an adhesive film with conductive particles (not shown) provide electrical interconnection between, for example, the circuit board and the flat panel display (not shown), without the use of solder. The area of the circuit 212 not covered by the adhesive may be covered by an optional protective cover coat film 220.

The substrates which may be used in the electronic assembly of the invention may vary widely depending on the intended application, and may comprise any generally insulative material having a conductive circuit on at least one surface thereof. Examples include flexible polymeric materials such as PET and polyimide, and rigid materials such as FR-4 and glass. Any metallic material may be used on the substrate depending on the intended application, such as thin films or strips of e.g., silver, gold, copper, etc., bonded to the substrate, or may consist of strips of an adhesive or ink which is electrically conductive or rendered electrically conductive by the presence of conductive particles. Copper is particularly preferred as a metallic material.

The adhesive composition of the electronic assembly of the invention, preferably provided in the form of a film, comprises a semi-crystalline copolymer, a tackifier, and conductive particles.

Figure 4:
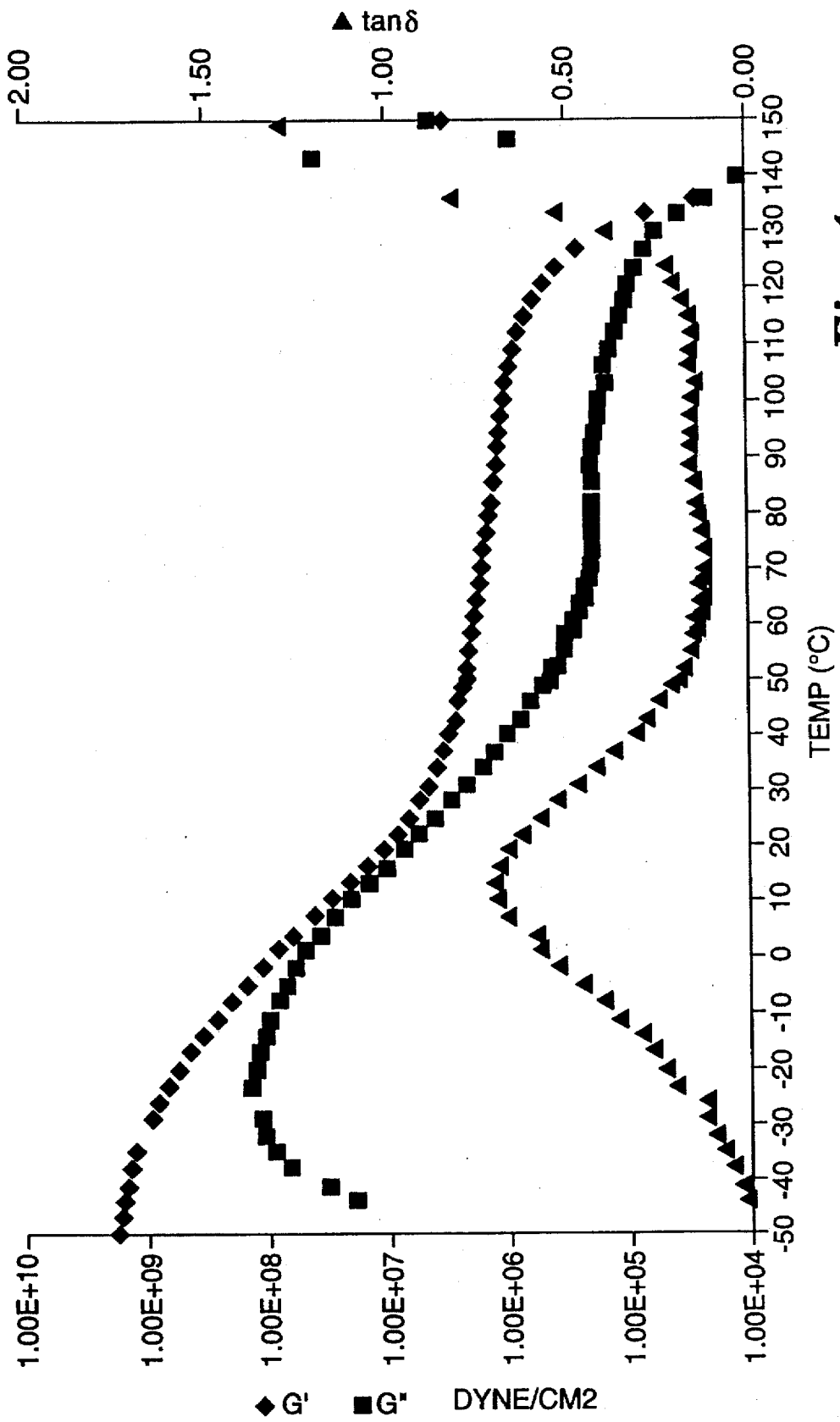
FIG. 4 is a dynamic mechanical analysis (DMA) spectrum of an adhesive composition of the present invention.

As explained in Ferry, *Viscoelastic Properties of Polymers*, 2d ed., John Wiley & Sons, 1970, the loss tangent, or tan δ, measures the ratio of energy lost, G", to energy stored, G', in a polymeric composition during a cyclic deformation (e.g. melting and recrystallization) procedure. A DMA plot of G", G', and tan δ, measured at 1 rad/sec, for a particularly preferred adhesive composition of the invention is shown in FIG. 4. The adhesive composition of the present invention is characterized as having a ratio of the loss modulus (G") to the storage modulus (G") , tan δ, equal to 1 at a temperature of about 90° C. to about 150° C. At the temperature where tan δ=1, the polymeric material has a storage modulus of less than about $2 \times 10^5$ dynes/cm$^2$; and, at a temperature 20° C. below the temperature where tan δ=1, the adhesive composition has a storage modulus greater than about $5 \times 10^5$ dynes/cm$^2$. The maximum value of tan δ, the glass transition temperature, $T_g$, of the adhesive composition is about −10° C. to about 40° C., preferably about 0° C. to about 20° C.

The DMA spectrum of the adhesive composition of the invention shown in FIG. 4 was based on samples run at 1 rad/sec in an RDA II DMA analyzer available from Rheometrics. The Autostrain function on the RDA II analyzer was set to about 75% of allowable strain, the adjustment factor was 30%, the maximum torque was 20 g cm, and the minimum torque was 10 g cm. The Autotension function on the RDA II analyzer was set to apply an axial force of 2.0 g with a sensitivity of 1.0 g. The geometry was parallel plate with a 4 mm radius, the step size was 3° C., the soak time was 5 seconds, and the strain was about 10–30% To collect the DMA spectrum, samples approximately 1 mm thick were loaded at 60° C., then ramped down to −50° C. in the first run. The samples were heated to 40° C. and then run from 40° C. to 150° C. in the second run.

The adhesive composition of the invention has a melt viscosity which permits it to flow easily at the bonding temperature, generally about 120° C. to about 150° C., preferably about 140° C., and wet the substrate during the bonding procedure. The modulus of the adhesive composition rises quickly upon cooling to provide good resistance to creep, and is sufficiently high in the finished bond to form a stress-resistant bond. However, the adhesive composition of the invention has sufficient elastic properties to provide good peel adhesion over an extended range of environmental conditions.

In contrast to conventional thermoplastic adhesive materials, the adhesive composition of the present invention includes a semi-crystalline copolymer. The term "semi-crystalline" as used herein refers to polymeric materials that show crystalline behavior, e.g., a sharp crystalline melting temperature, $T_c$, which is desirable for low temperature device/substrate bonding operations. The semi-crystalline polymeric materials of the invention also show a glass transition temperature, $T_g$. See, e.g., Odian, *Principles of Polymerization (Second Edition)*, John Wiley & Sons, New York, (1981), pages 25 and 30.

"Crystalline temperature" or "re-crystallization temperature," $T_c$, as used herein, is the temperature at which the liquid-to-solid phase transition occurs in semi-crystalline polymers, since in semi-crystalline polymers there is a hysteresis in the solid-liquid phase transition depending on the temperatures through which it is approached, i.e., heating the solid-to-liquid transition, or cooling the liquid-to-solid transition. "Glass Transition Temperature ($T_g$)" as used herein is defined as the temperature (actually a narrow range of temperatures) at which a second order phase transition occurs. Above $T_g$ the polymers are soft, flexible, rubbery materials, and below $T_g$ they are conversely hard, rigid plastics that behave like glass. The unknown $T_g$ of a given polymer can be determined using a variety of methods, and differential scanning calorimetry (DSC) is preferred.

The semi-crystalline polymeric materials of the invention provide creep resistance in the end use environment of the bonded electronic assembly up to the recrystallization temperature ($T_c$) which is higher than $T_g$. Despite the relatively low $T_g$, high dimensional stability of the bond is maintained at high temperature due to the semi-crystalline nature of the copolymer. The polymers have a crystallization temperature which insures high cohesion of the bond after recrystallization. The semi-crystallinity also provides a steep viscosity/temperature gradient near $T_m$ which leads to excellent flow of the adhesive during bonding operations. At the same time, the thermoplastic nature of the copolymer used in the adhesive composition of the invention provides a material that is fast bonding and repairable.

A semi-crystalline copolymer which may be used in the adhesive composition of the present invention to provide the above beneficial electrical properties comprises polyether monomeric units and polyamide monomeric units. The polyamide segment (PA) of the copolymer of the invention may vary widely, and any polyamide which includes a basic —C(O)NH— unit may be used. Examples include poly (caprolactam) (Nylon 6), poly(hexamethylene adipamide) (Nylon 6/6), poly(hexamethylene nonanediamide) (Nylon 6/9 ), poly(hexamethylene sebacemide) (Nylon 6/10), poly (hexamethylene dodecanediamide) (Nylon 6/12), poly (undecanoamide) (Nylon 11), poly(lauryllactam) (Nylon 12). Polyamide units with low moisture absorption are preferred for use in the present invention to prevent softening and increased electrical resistance of the adhesive composition under high humidity conditions, and Nylon 12 is particularly preferred. The polyether segment (PE) may also vary widely, and any polyether which contains a basic —R—O—R— unit, wherein R can be a substituted or unsubstituted alkyl group, may be used. Poly (tetramethylene glycol) is particularly preferred for use in the copolymer used in the adhesive composition of the present invention.

Each of the PA and PE monomeric units can independently repeat in the copolymer of the present invention, and the concentration of each in the copolymer may vary widely depending on the physical characteristics, mechanical properties, dynamic properties, thermal properties, electrical properties and environmental or chemical resistance desired in the adhesive composition. Generally, copolymers useful in the adhesive composition of the invention have a Shore D hardness of about 20 to about 70 at room temperature as measured according to ASTM D2240. The copolymer should also have a melt temperature $T_m$, of about 75° C. to about 220° C., preferably 100° C. to about 180° C. as measured by DSC according to ASTM D3418. "Melt temperature," $T_m$ as used herein, is the temperature at which the solid-to-liquid phase transition occurs in semi-crystalline polymers. The water absorption of the copolymer used in the adhesive composition of the invention may vary widely, but preferably ranges from about 1% by weight to about 4% by weight as measured according to the immersion test specified in ASTM D570, and should be no more than about 0.5% by weight following extended aging under 20° C./65% RH conditions.

A particularly preferred copolymer for use in the adhesive compositions of the present invention is shown below in Formula (I):

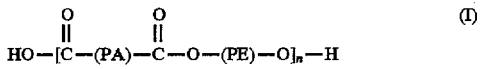

wherein PA represents a polyamide monomeric unit and PE represents a polyether monomeric unit. This preferred copolymer is available from Elf Atochem North America, Philadelphia, Pa., under the trade designation "PEBAX." A particularly preferred grade of PEBAX for use in the adhesive composition of the invention is "PEBAX 3533," in which the polyamide unit is Nylon 12 and the polyether unit is poly(tetramethylene glycol). This copolymer has a $T_g$ of about −78° C. and a Shore D hardness of about 35 at room temperature as measured according to ASTM D2240. The copolymer also has a melt temperature, $T_m$, of about 110° C. to about 155° C. as measured by DSC according to ASTM D3418. The preferred polyamide/polyether copolymer used in the adhesive composition of the invention has elastomeric properties which are important to provide flexible bonds to substrates such as metals, glass and other polymeric materials. The peel strength of the copolymer used in the adhesive composition of the invention is about 1400 grams/cm at 20° C. The copolymer is preferably present in the adhesive composition in an mount of about 60% to about 30% by weight, based on the total amount of the copolymer and a tackifier, which is described below.

The adhesive composition used in the electronic assembly of the invention further includes a tackifier to increase toughness of the bond and enhance peel adhesion to a wide range of substrate materials. Any tackifier that is compatible with the polyamide/polyether copolymer described above may be used, and examples of such useful tackifying resins include rosin, rosin esters available from Hercules under the trade designations "STAYBELITE 5" and "FORAL 85," phenolic modified rosins avaialable from Hercules under the trade designation "PENTALYN 856," terpene phenolics available from Hercules under the trade designation "PICCOFYN T," from DRT under the trade designation "DERTOPHENE T," from Yasuhara Chemical under the trade designation "T 130," from Arizona Chemical under the trade designation "NIREZ 2040," and from from Arakawa chemical under the trade designation "TAMANOL 135," terpenics available from DRT under the trade designation "DERCOLYTE A115," terpenics of alkyl aromatic hydrocarbons avaialable from Hercules under the trade designation "HERCULES AR 100," terpenes of an aromatic hydrocarbon available from Hercules under the trade designation "HERCULES A 120," terpenes of hydrogenated DCPD available from Exxon under the trade designation "ESCOREZ 5320," styrene based materials available from Hercules under the trade designation "KRISTALEX F 85," and coumarone indenes avaialable from VFT under the trade designation "B 1/2135." of the above, terpene phenolics are preferred, and NIREZ 2040 and TAMANOL 135 are particularly preferred.

The tackifier may be present in a wide range of concentrations, and should be blended with the copolymer in sufficient amounts to provide the adhesive composition with a $T_g$ of about −10° C. to about 40° C., preferably about 0° C. to about 20° C. Tackifying resins are useful in the present invention in an amount ranging from 40 to 70%, preferably about 50%, by weight based on the total weight of copolymer and tackifier present in the adhesive composition. The ratio by weight of copolymer to tackifier may be should be about 2:1 to about 0.5:1, and is most preferably about 1:1.

Conductive particles, including, for example, those described in U.S. Pat. No. 4,606,962 (Reylek et al.) and 4,740,657 (Tsukagoski et al.), which are incorporated by reference, are added to the adhesive composition of the present invention. The conductive particles may include electrically and thermally conductive particles. The particles typically have a thickness ranging from about 2 to about 20 microns, preferably about 4 to about 6 microns.

Conductive particles contained in adhesive films of the invention may be randomly dispersed therein or may be arranged in a uniform array of desired configuration. To economize the use of electrically conductive particles, the particles may be located only in segments of the adhesive film which are to contact individual electrical conductors. When solid metal or composite particles are used in the adhesive composition of the present invention, they are typically provided at concentrations ranging from about 1% to about 15%, preferably from about 2% to about 10%, and most preferably at about 4% to about 6%, by volume, based on the total volume of the composition.

The use of a filler in the adhesive composition can provide increased adhesion, higher modulus, and decreased coefficient of thermal expansion for particular applications. Some useful fillers include, but are not limited to, silica particles, silicate particles, quartz particles, ceramic particles, glass bubbles, inert fibers, and mica particles.

Typically, an adhesive composition of the present invention will also include other components, additives, or agents, depending on end use and processing conditions, to facilitate handling. For example, the composition may include solvents and coupling agents such as, for example, silanes, titanates, and zirconates. See, e.g., J. Cromyn *Structural Adhesives* edited by A. J. Kinloch, published by Elsevier Applied Science Publishers, 1986, pp. 269–312. The adhesive composition may also include antioxidants to prevent oxidative breakdown or undesirable crosslinking.

The adhesive composition of the invention may be prepared in a number of ways. The semi-crystalline copolymer and tackifier may simply be mixed in an appropriate heating vessel under a nitrogen atmosphere to a temperature sufficient to produce a clear, homogeneous melt, generally about 180° C. with stirring, and the conductive particles may then be added to the melt and dispersed as desired. Preferably, the copolymer, tackifier and conductive particles are blended in the barrel of an extruder as is well known in the art.

The adhesive composition of the present invention is preferably provided in the form of an adhesive film. The adhesive film of the present invention is preferably nontacky or slightly tacky at the intended handling temperature. An adhesive film of the present invention is typically coated on a release liner, and is storage stable for at least about one month at room temperature. The adhesive film is prepared by extrusion of the adhesive composition as is well known in the art. The adhesive composition of the invention may also be extruded into a multiple layered construction to tailor its material and/or electrical properties.

The adhesive compositions and films of the present invention are typically reworkable, i.e., entirely removable from a substrate at a temperature of less than about 150° C., preferably less than about 140° C. The reworkable adhesive of the invention will typically be entirely removable at $T_m$, because the use of excessively high temperatures may degrade the substrate or conductive devices thereon. The use of a suitable solvent, such as, for example, toluene or butanol or a mixture thereof, may also be necessary to remove remaining residue. It is preferred that the reworkable adhesive film be removable from a substrate selected from the group consisting of conductive materials such as copper, gold, silver, aluminum, nickel, and solder; dielectrics such as ceramic, glass, silicon epoxy/glass laminates; and polymer films such as polyimide and polyethylene terephthalate (PET).

The present invention also provides a method for forming a reworkable adhesive bond between a first substrate with a first conductive bonding site and a second substrate with a second bonding site to form a bonded composite.

The method comprises the steps of providing a first substrate with a first conductive bonding site, providing a second substrate with a second conductive bonding site, providing an adhesive film of the present invention; positioning the adhesive film between each of the first and second conductive bonding sites and each of the first and second substrates; and applying sufficient heat and/or pressure, for a sufficient time, to form a reworkable adhesive bond between each conductive bonding site and each conductive device.

The bonding time required for adhesives of the present invention are typically less than about 20 seconds, preferably less than about 5 to about 10 seconds, at a bonding temperature of less than about 160° C., preferably about 120° C. to about 150° C., and most preferably about 140° C. The bonding is typically carried out under a pressure of about 5 MPa.

In the following examples, which are intended to be merely illustrative and nonlimiting, all percentages are by weight, except as otherwise noted.

Example 1

Electrical resistance measurements were carried out on an adhesive film according to the present invention, both before and after accelerated aging testing, as described below.

The adhesive was prepared by mixing in a 1:1 weight ratio a polyamide-polyether copolymer available From Elf Atochem under the trade designation "PEBAX 3533" and a terpene phenolic tackifier commercially available From Yasuhara Chemical under the trade designation "T 130" The mixture was placed in a metal can. The can was heated from below with a hot plate and was also jacketed with a heating band. The settings were adjusted to give a temperature of 120°–150° C. within the can. The resins were stirred using an overhead stir motor with a propeller blade. When the resins became a clear, homogeneous melt, 5% by weight of conductive particles were added. The conductive particles were nickel-coated phenolic particles, available from JCI (Japan), under the trade designation "Bright" powder. The particles were dispersed by stirring for approximately 10 minutes. The mixture of resins and particles was then poured onto a silicone treated paper liner. Film was prepared by pressing the mixture between 5 mil Teflon sheets in a Carver press set at 150° C. The resulting thickness of the adhesive films was 2–3 mils.

The samples were prepared for bonding by tacking a piece of film to a 3-layer flex circuit made of gold on copper laminated to polyimide, from Minco Co. The flex circuit was then bonded to a sample of glass coated with electrically conductive indium-tin-oxide (ITO) using a hot bar bonder with pulse heating. The 3 mm bonding head was pressed onto the film with a pressure of approximately 5MPa, and then rapidly heated to a set point temperature which led to a temperature of about 140° C. in the adhesive. The film was held at 140° C. for about 10 seconds, and subsequently cooled under a pressure of about 5 MPa to a temperature of about 95° C.

Electrical resistance of the conductive adhesive bond was measured before and after subjecting the samples to accelerated aging at various temperature and humidity conditions as set forth in Table 1 below, according to the principles of test method ASTM B 539–90, such that the extraneous resistance was minimized.

In Table 1 below, the data set designation PEBA refers to the adhesive composition described above. The letters A and B refer to replications of the same experiment. The numbers in the data set names refer to the test conditions, as described below.

TABLE 1

| NAME | TIME (hr.) | MAX. (ohms) | MIN. (ohms) | AVE. (ohms) |
| --- | --- | --- | --- | --- |
| PEBA 20 A | 0 | 0.83 | 0.465 | 0.58 |
| PEBA 20 A | 1005 | 3.412 | 1.333 | 2.18 |
| PEBA 20 B | 0 | 0.749 | 0.481 | 0.56 |
| PEBA 20 B | 1005 | 2.516 | 1.432 | 1.84 |
| PEBA 60 A | 0 | 0.874 | 0.49 | 0.59 |
| PEBA 60 A | 1005 | 11.074 | 1.961 | 5.46 |
| PEBA 60 B | 0 | 0.721 | 0.501 | 0.57 |
| PEBA 60 B | 1005 | 5.379 | 1.56 | 2.49 |
| PEBA 85 A | 0 | 1.066 | 0.62 | 0.77 |
| PEBA 85 A | 1005 | 6.545 | 3.568 | 4.73 |
| PEBA 85 B | 0 | 0.785 | 0.48 | 0.57 |
| PEBA 85 B | 1005 | 7.893 | 4.623 | 6.19 |

20 = sample temperature cycled between −20° C. and +70° C.
60 = sample aged at 60° C. and 95% relative humidity
85 = sample aged at 85° C. and 85% relative humidity

Example 2

Adhesive films were prepared in a Brabender mixer using the resins and tackifiers shown in the table below. In all cases, conductive particles (air classified <11 microns nickel particles available from Novamet under the trade designation INCO 123) were added to a level of about 15% by weight.

A 35 micron conductive adhesive film was laminated onto a substrate consisting of a 25 μm thick polyester terephthalate (PET) base, upon which was formed a test circuit of copper stripes with a 200 micron pitch. This 2 cm-long test piece was bonded on one end to a piece of glass coated with electrically conductive indium-tin-oxide (ITO). The other end was bonded to a circuit board with the corresponding 200 micron pitch traces of 1 oz. copper with a 1.3 micron gold flash.

The films were bonded using a hot bar bonder with pulse heating. The 3 mm wide bonding head was pressed onto the film with a pressure of approximately 5 MPa and then rapidly heated to a set point temperature which led to a temperature of about 140° C. in the adhesive. The film was held at 140° C. for 20 seconds followed by cooling under pressure to a temperature of 95° C.

Testing was carried out by measuring, with the four-point method, a circuit which contained two adhesive connections to the circuit board, two adhesive connections to the ITO glass, 2 cm of copper trace on the PET, and 100 microns of ITO. The testing was conducted according to the principles of test method ASTM B 539-90 such that the extraneous resistance was minimized. The results are set forth in Table 2 below:

TABLE 2

| Sample No. | Resin | Tackifier | Resin to Tackifier Ratio | Initial Peel (gm/cm) | Aged Peel (gm/m) | Avg. Initial Resistance (ohms) | Aging Condition (°C/% RH) | Time (Hrs) | Ave. Aged Resistance (ohms) |
|---|---|---|---|---|---|---|---|---|---|
| 1 | Pebax 3533 | Nirez 2040 | 1:1 | 1700 | 1400 | 6.2 | 60/95 | 906 | 17.1 |
| 2 | Pebax 3533 | Nirez 2040 | 2:1 | 830 | 510 | 1.9 | 60/95 | 906 | 12.9 |
| 3 | Pebax 4033 | Nirez 2040 | 1:1 | 2000 | 870 | 1.7 | 60/95 | 906 | 8.6 |
| 4 | Pebax 3533 | Tamanol 135 | 1:1 | 3500 | 2350 | 2.3 | 60/95 | 1059 | 12.8 |
| 5 | Pebax 3533 | T-130 | 1:1 | 1550 | 720 | 2.3 | 60/95 | 1059 | 15.6 |
| 6 | Pebax 3533 | Nirez 2040 | 1:1 | | | 2.8 | 85/85 | 1304 | 20.3 |
| 7 | Pebax 3533 | Nirez 2040 | 1:1 | | | 2.9 | −20° C. to +70° C. cycle | 1304 | 16.2 |

Pebax 3533 and 4033 from Elf Atochem
Nirez 2040 from Arizona Chemical
Tamanol 135 from Arakawa Chemical
T-130 from Yasuhara Chemical Various modifications and alterations of this invention will become apparent to those skilled in the art without departing from the scope and spirit of this invention.

We claim:

1. An electronic assembly, comprising:
    (a) a first substrate with at least one first conductive bonding site;
    (b) a second substrate with at least one second conductive bonding site; and
    (c) a polymeric adhesive composition between said first and second substrates and said first and second bonding sites, wherein the adhesive composition, measured by DMA at 1 rad/second, has a ratio of loss modulus (G") to storage modulus (G'), tan δ=1, at a temperature of about 90° C. to about 150° C., and wherein at the temperature where tan δ=1, the adhesive composition has a storage modulus (G') of less than about $2 \times 10^5$ dynes/cm$^2$; and, at a temperature 20° C. below the temperature where tan δ=1, the adhesive composition has a storage modulus (G") greater than about $5 \times 10^5$ dynes/cm$^2$, and wherein the $T_g$ of the adhesive composition is about −10° C. to about 40° C.

2. An electronic assembly as claimed in claim 1, wherein the first substrate and the second substrate are selected from the group consisting of printed circuit boards, integrated circuits, and flexible circuits.

* * * * *